United States Patent [19]

Kajikawa et al.

[11] Patent Number: 5,673,283
[45] Date of Patent: Sep. 30, 1997

[54] SEMICONDUCTOR DEVICE AND FABRICATING METHOD THEREOF

[75] Inventors: Yasutomo Kajikawa; Motoharu Miyashita; Shoichi Karakida; Akihiro Shima, all of Tokyo, Japan

[73] Assignee: Mitsubishi Denki Kabushiki Kaisha, Tokyo, Japan

[21] Appl. No.: 613,237

[22] Filed: Mar. 8, 1996

[30] Foreign Application Priority Data

Jun. 29, 1995 [JP] Japan .................................. 7-164124

[51] Int. Cl.$^6$ .................................................. H01S 3/19
[52] U.S. Cl. .............................. 372/46; 372/45; 437/129
[58] Field of Search .......................... 372/45, 46; 437/129

[56] References Cited

U.S. PATENT DOCUMENTS

| | | | |
|---|---|---|---|
| 5,048,036 | 9/1991 | Scifres et al. | 372/45 |
| 5,208,182 | 5/1993 | Narayan et al. | 437/110 |
| 5,491,709 | 2/1996 | Seko et al. | 372/45 |

FOREIGN PATENT DOCUMENTS

0428913  5/1991  European Pat. Off.

OTHER PUBLICATIONS

Offsey et al, "Strained-Layer InGaAs-GaAs-AlGaAs Lasers Grown By Molecular Beam Epitaxy For High-Speed Modulation", IEEE Journal of Quantum Electronics, vol. 27, No. 6, Jan. 1991, pp. 1455–1462.

Chen et al, "Self-Aligned InGaAs/GaAs/InGaP Quantum Well Lasers Prepared By Gas-Source Molecular Beam Epitaxy With Two Growth Steps", Applied Physics Letters, vol. 59, No. 23. 1991, Dec. pp. 2929–2931.

Sugiura et al., "Metalorganic Molecular Beam Epitaxy of Strain-Compensated InAsP/InGaAsP Multi-Quantum-Well Lasers", J. Appl. Phys., vol. 79, No. 3, Feb. 1996; pp. 1233–1237.

Marée et al., "Generation Of Misfit Dislocations In Semiconductors", J. Appl. Phys., vol. 62, No. 11, Dec. 1987, pp. 4413–4420.

Beernink et al., "Characterization of InGaAs–GaAs strained-Layer Lasers With Quantum Wells Near The Critical Thickness", Appl. Phys. Letters, vol. 55, No. 21, Nov. 1989, pp. 2167–2169.

*Primary Examiner*—James W. Davie
*Attorney, Agent, or Firm*—Leydig, Voit & Mayer, Ltd.

[57] ABSTRACT

A semiconductor device includes a semiconductor substrate, a strained multi-quantum well with alternatingly laminated first barrier layers and well layers with second barrier layers as outermost layers of the strained MQW structure. The strained MQW structure has a safety factor $K_{safe}=3.9$; and $$K_{safe} f_{av} t_{total} < \frac{b_p(1-v/2)}{80\sqrt{3}\,(1+v)} \left[ -\frac{1}{2} + \ln\left(\frac{4r_c}{b_0}\right) \right]$$

Therefore, it is possible to make the strained MQW structure have a sufficient margin with respect to critical conditions concerning the generation of dislocations, and deterioration of operational characteristics in continuous operation of the semiconductor device can be suppressed so that the reliability of the semiconductor device is enhanced.

5 Claims, 3 Drawing Sheets

SEMICONDUCTOR DEVICE AND FABRICATING METHOD THEREOF

FIELD OF THE INVENTION

The present invention relates to a semiconductor device, more particularly, to a semiconductor laser having a strained multi-quantum well structure active layer which requires a high reliability. The present invention also relates to a method for fabricating such a semiconductor device.

BACKGROUND OF THE INVENTION

Generally, when a semiconductor layer which has a lattice constant different from that of a semiconductor substrate is epitaxially grown on the semiconductor substrate, a lot of dislocations are generated in the semiconductor layers and a good crystal is difficult to obtain. However, when the thicknesses of the semiconductor layers are less than a critical thickness, the generation of dislocations is suppressed, and semiconductor layers are pseudomorphically grown on the semiconductor substrate. However, since these layers are pseudomorphically grown on the semiconductor substrate having a different lattice constant, they have lattice strains. The critical thickness depends on the kinds of semiconductors constituting the semiconductor substrate and the semiconductor grown layers. In the semiconductor laser having an active layer comprising a quantum well structure, a device which utilizes the above-described strained layers for the well layer of the quantum well structure has been developed.

It is known that, in order to secure a high reliability in a strained single quantum well semiconductor laser having only a single well layer in the quantum well structure active layer, which well layer is a strained lattice layer, it is required that the strain and the thickness of the well layer have sufficient margins for the critical conditions concerning the generation of dislocations, as disclosed in K. J. Beernink, P. K. York, J. J. Coleman, R. G. Waters, J. Kim and C. M. Wayman, Appl. Phys. Lett. 55(1989)2167.

It is also reported that when the strain is f and the thickness of the strained layer is t, the condition which would not generate dislocations is represented by;

$$ft < \frac{b_p(1 - v/2)}{80\sqrt{3}\,(1+v)} \left[ -\frac{1}{2} + \ln\left(\frac{4r_c}{b_0}\right) \right] \quad (1)$$

(P. M. J. Maree, J. C. Barbour, J. F. van der Veen, K. L. Kavanagh, C. W. T. Bulle-Lieuwma and M. P. A. Vieger, J. Appl. Phys. 62(1987)4413). In the above-described formula (1), v, $b_0$, $b_p$, and $r_c$ are respectively, Poisson ratio, magnitude of the Burgers vector of closed loop dislocations, magnitude of the Burgers vector of open loop dislocations, and the half loop radius of the dislocations.

Accordingly, in order to fabricate a strained single quantum well semiconductor laser having a high reliability, it is only desired to make the strain f and the thickness of the well layer t satisfy the relation of the formula (1).

On the other hand, in order to increase output power of a semiconductor laser, it is, as well known, more advantageous to employ a multi-quantum well structure comprising a plurality of quantum wells than to employ the above-described single quantum well structure for the active layer. When employing a strained multi-quantum well structure in place of the strained single quantum well structure, it is not only required for the respective strained well layers to have sufficient margins for the critical conditions concerning generation of dislocations, respectively, but also for the strained multi-quantum well structure in its entirety to have sufficient margins for the critical conditions concerning generation of dislocations.

It is thought, as described above, that the strained multi-quantum well structure active layer is effective for increasing the output of a semiconductor laser. In a strained multi-quantum well structure, however, it was not clear how much margin the strain and the thickness of respective well layers should have against the critical conditions concerning the generation of dislocations and therefore, it was difficult to obtain a strained multi-quantum well structure semiconductor laser having a high reliability.

SUMMARY OF THE INVENTION

It is an object of the present invention to provide a semiconductor device that includes a strained multi-quantum well structure active layer having a sufficient margin with respect to the critical conditions concerning the generation of dislocations and that has a high reliability.

It is another object of the present invention to provide a method for producing such a semiconductor device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor device includes:

- a semiconductor substrate body having a surface; a strained multi-quantum well (hereinafter referred to as MQW) structure formed on the surface of the semiconductor substrate body;
- the MQW structure alternatively laminating a plurality of barrier layers each comprising a semiconductor crystal having a lattice constant approximately equal to that of a semiconductor crystal constituting the semiconductor substrate and a plurality of well layers each comprising a semiconductor crystal having a lattice constant larger than that of and an energy band gap smaller than that of the semiconductor crystal constituting the semiconductor substance, so that the barrier layers may be positioned at the uppermost layer and the lowermost layer of the MQW structure;
- the plurality of well layers having respectively the same thickness $t_w$, and the plurality of barrier layers other than the lowermost layer and the uppermost layer of the strained MQW structure respectively having the same thicknesses $t_b$; and
- when the number of the well layers is n, the strain of each well layer is $f_w$, the distance between the interface between the barrier layer and the well layer which is positioned the closest to the semiconductor substrate and the interface between the barrier layer and the well layer which is positioned the farthest from the semiconductor substrate in the strained MQW structure is $$t_{total} = nt_w + (n-1)t_b;$$

the strain of the well layer $f_{av}$ that is averaged over these interfaces is $$f_{av} = nt_w f_w / t_{total};$$

the Poisson ratio in the well layer is v, the magnitude of the Burgers vector of perfect dislocations in the well layer is $b_0$, the magnitude of the Burgers vector of partial dislocations in the well layer is $b_p$, the ratio of rigidity is $\mu$, the stacking fault energy per unit area is $\gamma$, the radius of half loop of the dislocations is $r_c$, the magnitude of the resolved shear stress in the guide plane is $\tau$, the distance between a pair of partial dislocations is d, then a relation of $b_0 = 3^{1/2} b_p$ stands; and when the $r_c$ is taken as a solution of $$r_c = \frac{1}{(\sqrt{3}/2)\pi\tau b_0} \left[ \frac{\mu b_p^2 (1-\nu/2)}{2(1-\nu)} \left( 1 + \ln \frac{4r_c}{b_0} \right) + \pi d(\gamma + \tau b_p/2) \right],$$

the $\tau$ is represented by $$\tau = \left[ \frac{2}{3} \sqrt{2} \, \mu(1+\nu)/(1-\nu) \right] f_{av}, \text{ and}$$

$$d = [\mu b_p^2 (1-\nu/2)/4\pi(1-\nu)][1/(\gamma + \tau b_p/2)],$$

a safety factor for the critical condition concerning the generation of dislocations in the well layer is $K_{safe}$, the $K_{safe}$ stands as $K_{safe} = 3.9$; and $$K_{safe} f_{av} f_{total} < \frac{b_p(1-\nu/2)}{80\sqrt{3}(1+\nu)} \left[ -\frac{1}{2} + \ln \left( \frac{4r_c}{b_0} \right) \right]$$

stands.

Therefore, it is possible to make the strained MQW structure as a whole have a sufficient margin with respect to the critical conditions concerning the generation of dislocations, and the deterioration of operation characteristics can be suppressed in the continuous operation of the semiconductor device and the reliability of the semiconductor device is enhanced.

According to a second aspect of the present invention, the above-described semiconductor device further includes the semiconductor substrate body comprising a GaAs semiconductor substrate having a (001) surface and a semiconductor substrate layer having a surface comprising a semiconductor crystal having a lattice constant that is approximately equal to that of GaAs, which layer is epitaxially grown on the (001) surface of the GaAs semiconductor substrate, and the strained MQW structure is grown on the surface of the semiconductor substrate layer, the well layer in the strained MQW structure comprises InGaAs and the barrier layer in the strained MQW comprises GaAs or AlGaAs, the $b_0$ is 0.40 nm, the $\nu$ is 0.31, the $\mu$ is $3.2 \times 10^{11}$ erg/cm$^3$, and the $\gamma$ is 18 erg/cm$^2$.

Therefore, it is possible to make the InGaAs/GaAs strained multi-quantum well structure as a whole or the InGaAs/AlGaAs strained multi-quantum well structure as a whole have a sufficient margin with respect to the generation of the dislocations. Thereby, deterioration of operation characteristics in the continuous operation of the semiconductor device can be suppressed and the reliability of the semiconductor device is enhanced.

According to a third aspect of the present invention, in the above-described semiconductor device, the strained MQW structure is an active layer of a semiconductor laser.

Therefore, it is possible to make the strained multi-quantum well structure as a whole have a sufficient margin with respect to the Generation of the dislocations. Thereby, the deterioration of operation characteristics can be suppressed in the continuous operation of the semiconductor laser and the reliability of the semiconductor laser is enhanced.

According to a fourth aspect of the present invention, a method for fabricating a semiconductor device comprises:

growing on a first conductivity type semiconductor substrate a first cladding layer comprising a first conductivity type semiconductor crystal having a lattice constant approximately equal to that of a semiconductor crystal constituting the semiconductor substrate;

epitaxially growing a plurality of barrier layers and a plurality of well layers alternately laminated with each other, each the barrier layer comprising a semiconductor crystal having a lattice constant that is approximately equal to that of and an energy band gap smaller than that of a semiconductor crystal constituting the first cladding layer and each the well layer comprising a semiconductor crystal having a lattice constant larger than that of and an energy band gap smaller than that of a semiconductor crystal constituting the barrier layer, thereby to form a strained multi-quantum well structure having the barrier layers as the lowermost layer and the uppermost layer and, serving as an active layer oscillating a laser light output;

successively epitaxially growing on the active layer a second cladding layer comprising a semiconductor crystal having a lattice constant approximately equal to that of the semiconductor crystal constituting the semiconductor substrate and having a second conductivity type that is opposite to the first conductivity type;

forming an insulating film in a stripe shape on the second cladding layer, etching the second cladding layer to a predetermined depth using the insulating film as a mask, thereby to form a stripe shaped mesa comprising a portion of the second cladding layer remaining beneath the insulating film;

selectively growing current blocking layers comprising a semiconductor crystal of the first conductivity type at both sides of the stripe shaped mesa and then removing the insulating film;

epitaxially growing a contact layer comprising the second conductivity type semiconductor crystal on the entire surface of the current blocking layers and the exposed surface of the second cladding layer;

forming a front surface electrode on the surface of the contact layer in ohmic contact with the contact layer and a rear surface electrode on the rear surface of the semiconductor substrate in ohmic contact with the semiconductor substrate;

forming cleavage surfaces perpendicular to the direction of extension of the stripe mesa, which cleavage surfaces serve as laser resonator facets; and the strained MQW structure comprising one in which, the plurality of well layers respectively have the same thicknesses $t_w$, and the plurality of barrier layers other than the lowermost layer and the uppermost layer of the strained MQW structure respectively have the same thicknesses $t_b$; and when the number of the well layer is n and the strain of each the well layer is $f_w$;

the distance between the interface between the barrier layer and the well layer which is positioned the closest to the semiconductor substance and the interface between the barrier layer and the well layer which is positioned the farthest from the semiconductor substrate in the strained MQW structure is $$t_{total} = nt_w + (n-1)t_b;$$

the strain of the well layer $f_{av}$ that is averaged over these interfaces is $$f_{av} = nt_w f_w / t_{total};$$

the Poisson ratio in the well layer is v, the magnitude of the Burgers vector of perfect dislocations in the well layer is $b_0$, the magnitude of the Burgers vector of partial dislocations in the well layer is $b_p$, the ratio of rigidity is μ, the stacking fault energy per unit area is γ, the radius of half loop of the dislocations is $r_c$, the magnitude of the resolved shear stress in the guide plane is τ, the distance between a pair of partial dislocations is d, then a relation of $b_0 = 3^{1/2} b_p$ stands; and when the $r_c$ is taken as a solution of $$r_c = \frac{1}{(\sqrt{3}/2)\pi\tau b_0} \left[ \frac{\mu b_p^2 (1 - v/2)}{2(1-v)} \left( 1 + \ln\frac{4r_c}{b_0} \right) + \pi d(\gamma + \tau b_p/2) \right],$$

the τ is represented by $$\tau = \left[ \frac{2}{3} \sqrt{2} \; \mu(1+v)/(1-v) \right] f_{av},$$

the d is represented by $$d = [\mu b_p^2 (1-v/2)/4\pi(1-v)][1/(\gamma + \tau b_p/2)], \text{ and}$$

a safety factor for the critical condition concerning the generation of dislocations in the well layer is $K_{safe}$, then
the $K_{safe}$ stands as
the $K_{safe} = 3.9$; and $$K_{safe} f_{av}^2 t_{total} < \frac{b_p(1 - v/2)}{80\sqrt{3}\;(1+v)} \left[ -\frac{1}{2} + \ln\left(\frac{4r_c}{b_0}\right) \right]$$

stands.

Therefore, in the semiconductor device fabricated by this method, it is possible to make the strained MQW structure as a whole have a sufficient margin with respect to the critical conditions concerning the generation of dislocations, and the deterioration of operation characteristics can be suppressed in the continuous operation of the semiconductor device and the reliability of the semiconductor device is enhanced.

DETAILED DESCRIPTION OF THE PREFERRED EMBODIMENTS

Figure 1:
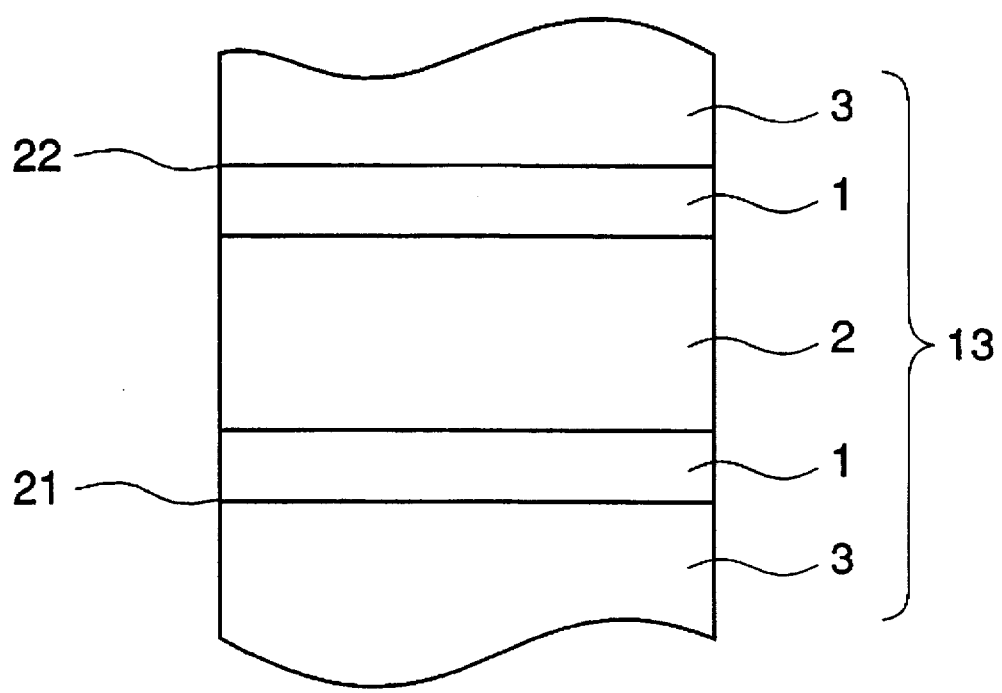
FIG. 1 is a cross-sectional view of a strained MQW structure active layer in a semiconductor laser according to a first embodiment of the present invention.

FIG. 1 is a cross-sectional view illustrating a strained double MQW structure constituting an active layer of a semiconductor laser according to a first embodiment of the present invention. In the figure, reference numeral 1 designates an $In_{0.2}Ga_{0.8}As$ strained quantum well layer having a layer thickness of 7 nm. Reference numeral 2 designates an $Al_{0.2}Ga_{0.8}As$ barrier layer having a layer thickness of 20 nm disposed between the well layers 1. Reference numeral 3 designates an $Al_{0.2}Ga_{0.8}As$ barrier layer having a layer thickness of 30 nm, contacting a well layer 1 at the outside of the strained double MQW structure. The strained double quantum well structure active layer 13 comprises these well layers 1 and barrier layers 2 and 3. The barrier layers 3 positioned adjacent the outermost of the well layers 1 have also a function as a guiding layer for guiding the laser light generated in the active layer.

A description is given of a method for fabricating a semiconductor laser provided with the strained double MQW structure active layer shown in FIG. 1. FIGS. 2(a)-2(e) are cross-sectional views illustrating a method of fabricating a semiconductor laser.

Figure 2:
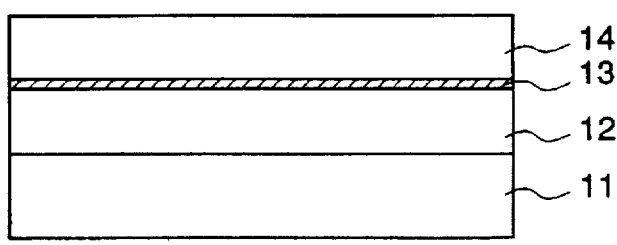
FIGS. 2(a)-2(e) are cross-sectional views illustrating a method for fabricating the semiconductor laser device including the strained double quantum well structure active layer according to the first embodiment of the present invention.
Figure 2:
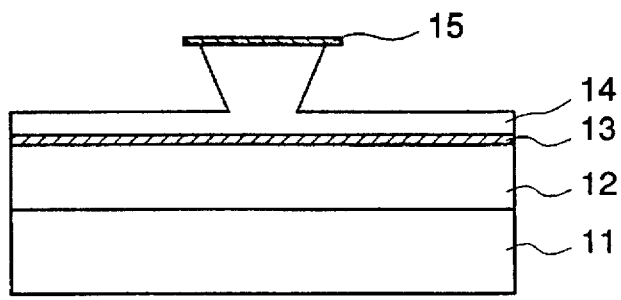
Figure 2:
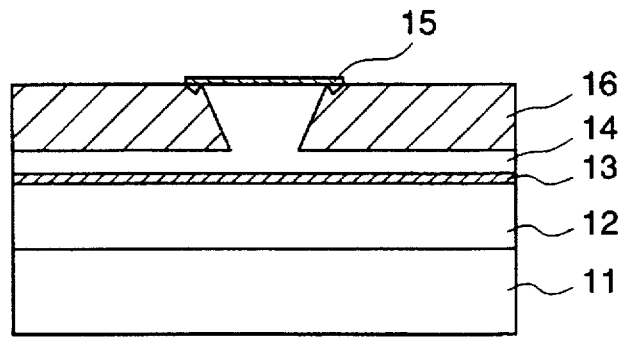
Figure 2:
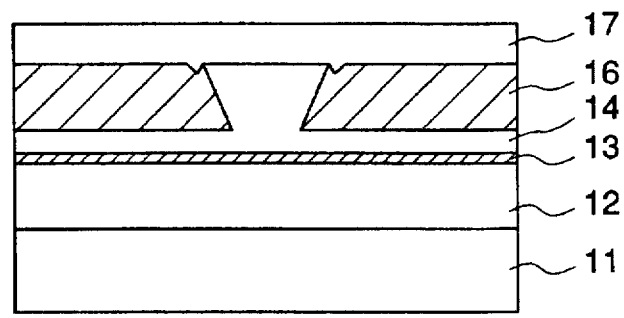
Figure 2:
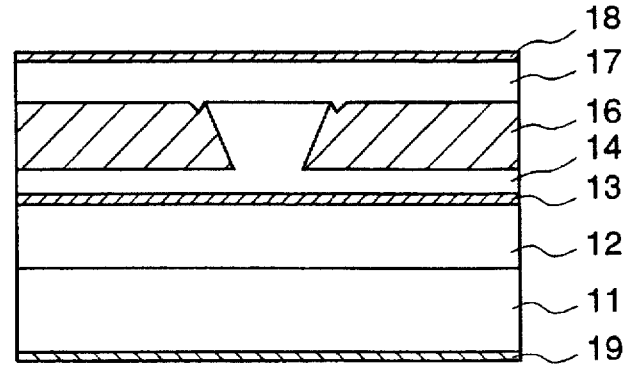

First of all, in the process of FIG. 2(a), a Se doped n type $Al_{0.48}Ga_{0.52}As$ cladding layer 12 having a carrier concentration of about $4 \times 10^{17}$ cm$^{-3}$ and 2 μm thick, and having a lattice constant approximately equal to that of GaAs is epitaxially grown on the surface of an n type GaAs substrate 11. Thereafter, barrier layers 2 and 3 comprising $Al_{0.2}Ga_{0.8}As$, which has a lattice constant approximately equal to that of $Al_{0.48}Ga_{0.52}As$ and an energy band gap smaller than that of $Al_{0.48}Ga_{0.52}As$, and well layers 1 comprising $In_{0.2}Ga_{0.8}As$, having a lattice constant larger than that of $Al_{0.2}Ga_{0.8}As$ and an energy band gap smaller than that of $Al_{0.2}Ga_{0.8}As$, are epitaxially grown on the cladding layer 12 so that the layers 2, 3 and 1 are laminated with each other as in FIG. 1, thereby forming a strained double MQW structure active layer 13. Further, a Zn doped p type $Al_{0.48}Ga_{0.52}As$ cladding layer 14 having a carrier concentration of about $2 \times 10^{18}$ cm$^{-3}$ and 2 μm thick is epitaxially grown on the strained double MQW structure active layer 13. The growth of these layers is performed by metal organic chemical vapor deposition (MOCVD).

In the step of FIG. 2(b), a silicon dioxide film 15 is formed on a stripe shaped region of the p type AlGaAs cladding layer 14, and using this silicon dioxide film 15 as a mask, the p type AlGaAs cladding layer 14 is etched to a predetermined depth, and a stripe shaped mesa comprising the p type AlGaAs cladding layer 14 remaining beneath the silicon dioxide film 15 is formed. In the process of FIG. 2(c), using the silicon dioxide film 15 as a mask, a Si doped n type $Al_{0.7}Ga_{0.3}As$ current blocking layer 16 having a carrier concentration of about $1 \times 10^{18}$ cm$^{-3}$ is selectively grown on both sides of the stripe mesa. Next, after removing the silicon dioxide film 15, in the process of FIG. 2(d), on the entire surface of the exposed surface of the p type AlGaAs cladding layer 14 and the exposed surface of the current blocking layer 16, a Zn doped GaAs contact layer 17, 2.5 μm thick and having a carrier concentration of $2 \times 10^{19}$ cm$^{-3}$ is grown by MOCVD. Thereafter, in the process of FIG. 2(e), a surface electrode 18 is provided on the surface of the contact layer 17 in ohmic contact with the contact layer 17, a rear surface electrode 19 is provided on the rear surface of the n type GaAs substrate 11 in ohmic contact with the substrate, and planes perpendicular to the direction in which the stripe mesa extends are formed by cleaving as resonator facets of the semiconductor laser, whereby a semiconductor laser provided with the strained double MQW structure active layer 13 is completed.

When in a general strained MQW well structure it is supposed that the well layers respectively have the same layer thickness $t_w$, the barrier layers other than the lowermost layer and the uppermost layer of the strained MQW well structure, i.e., the barrier layers between pairs of the well layers respectively have the same layer thickness $t_b$, the number of well layers is n, and the strain of the respective layers is $f_w$, the total layer thickness $t_{total}$ from the barrier layer-well layer interface closest to the substrate to the barrier layer-well layer interface most distant from the substrate is $$t_{total} = nt_w + (n-1)t_b,$$

and the strain that is averaged between these interfaces $f_{av}$ is represented by $$f_{av} = nt_w f_w / t_{total}.$$

In the strained MQW structure shown in FIG. 1, by making the layer thickness of the $In_{0.2}Ga_{0.8}As$ well layer 1 7 nm and the layer thickness of the $Al_{0.2}Ga_{0.8}As$ barrier layer 2 20 nm, the strain of the well layer $f_{av}$ that is averaged between the $In_{0.2}Ga_{0.8}As/Al_{0.2}Ga_{0.8}As$ hetero interface 21 that is positioned at the closest to the substrate and the $In_{0.2}Ga_{0.8}As/Al_{0.2}Ga_{0.8}As$ hetero interface 22 that is positioned at the most distant from the substrate is 0.588% and the total layer thickness $t_{total}$ between these interfaces is 34 nm. Here, if the degree of margin K for the critical conditions for generating dislocations in the strained well layer of the strained MQW structure is defined by $$K = \frac{b_p(1-v/2)}{80\sqrt{3}(1+v)} \left[ -\frac{1}{2} + \ln\left(\frac{4r_c}{b_0}\right) \right] / f_{av}^2 t_{total} \quad (2)$$

K=4.6 in the strained MQW structure shown in FIG. 1. In this formula (2), the Poisson ratio in the well layer is v, the magnitude of the Burgers vector of closed loop dislocations in the well layer is $b_0$, the magnitude of the Burgers vector of open loop dislocations in the well layer is $b_p$, and the half loop radius of the dislocations is $r_c$. Meanwhile, between the $b_0$ and the $b_p$, a relation of $b_0 = 3^{1/2} b_p$ stands. Further, when it is assumed that in the well layer, the ratio of rigidity is μ, the stacking fault energy per unit area is γ, the magnitude of the resolved shear stress in the guide plane is τ, the distance between a pair of open loop dislocations is d, $r_c$ is a solution of $$r_c = \frac{1}{(\sqrt{3}/2)\pi \tau b_0} \left[ \frac{\mu b_p^2(1-v/2)}{2(1-v)} \left(1 + \ln\frac{4r_c}{b_0}\right) + \pi d(\gamma + \tau b_p/2) \right]$$

Here, τ is represented as $$\tau = \left[ \frac{2}{3} \sqrt{2} \ \mu(1+v)/(1-v) \right] f_{av}$$

and d is represented as $$d = [\mu b_p^2(1-v/2)/4\pi(1-v)][1/(\gamma + \tau b_p/2)]$$

In the MQW structure shown in FIG. 1, $b_0$=0.40 nm, v=0.31, μ=$3.2 \times 10^{11}$ erg/cm$^3$, and γ=18 erg/cm$^2$.

Figure 3:
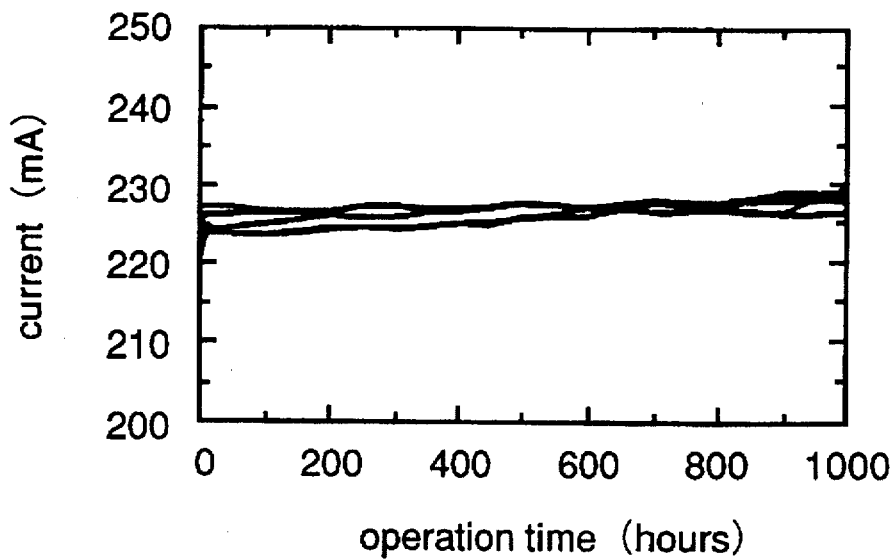
FIG. 3 is a diagram illustrating the result of continuous operation test at a temperature of a 50° C. and an output of 150 mW that is performed for the semiconductor laser of FIG. 1 including the strained double quantum well structure having a margin K of 4.6 for the active layer.

FIG. 3 shows the result of the continuous operation test (the number of the samples is 5) for semiconductor lasers having the quantum well structures shown in FIG. 1 as active layers at a temperature of 50° C. and a light output power of 150 mW. In the figure, the abscissa represents continuous operation time (unit: hours), and the ordinate represents a driving current that is supplied to the semiconductor laser so that a light output power of 150 mW may be obtained. Almost all of the lasers do not show an increase of current even after a continuous operation of about 1000 hours. This means that these semiconductor lasers have high reliability.

Figure 4:
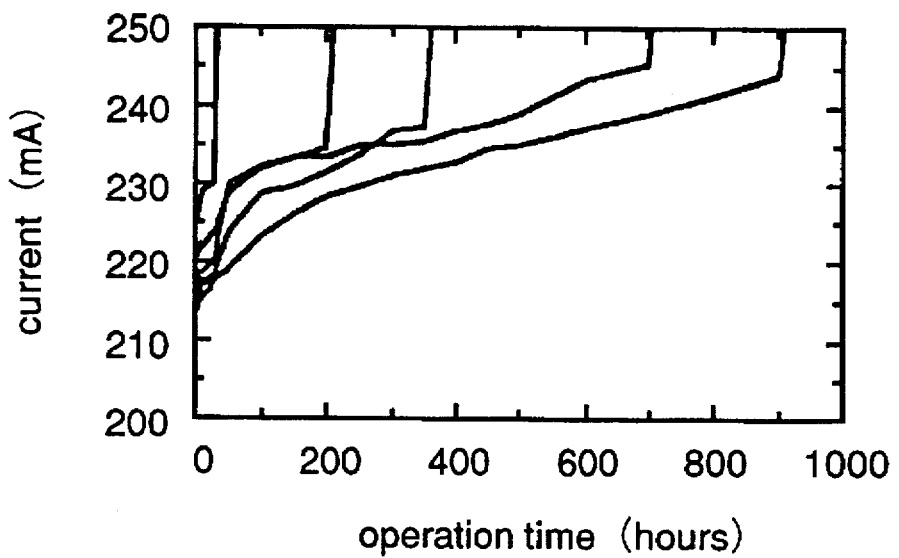
FIG. 4 is a diagram illustrating the result of a continuous operation test at a temperature of 50° C. and an output of 150 mW that is performed for the semiconductor laser having a strained quantum well structure having a margin K of 3.3 for the active layer.

On the other hand, FIG. 4 shows the result of a continuous operation test (the number of the samples is 5) for a semiconductor laser having a strained double quantum well structure having the same structure as the quantum well structure shown in FIG. 1 except than that the thickness of the $Al_{0.2}Ga_{0.8}As$ barrier layer 2 between the well layers is 12 nm at a temperature of 50° C. and an output power of 150 mW. It is found that deterioration starts at several tens of hours directly after the start of operation and none of the lasers are in operation as long as 900 hours. This shows that the reliability of the semiconductor laser is not sufficient. In this case, the average strain $f_{av}$ between the $In_{0.2}Ga_{0.8}As/Al_{0.2}Ga_{0.8}As$ hetero interface positioned closest to the substrate and the $In_{0.2}Ga_{0.8}As/Al_{0.2}Ga_{0.8}As$ hetero interface positioned most distant from the substrate is 0.770%, the total thickness $t_{total}$ is 26 nm, and the degree of margin K for the critical conditions for generating dislocations in the strained well layer is 3.3.

Although the above-described degree of margin K, i.e., 4.6 is sufficient to obtain high reliability as described above, a value of 3.3 is not sufficient for that purpose. From this fact, it is assumed that the condition for obtaining a semiconductor laser having high reliability is that the degree of margin K be larger than 3.9. In other words, if the safety factor is made $K_{safe}$, and $K > K_{safe}$ is assumed to be a condition for obtaining high reliability, $K_{safe}$=3.9 is obtained.

In this embodiment, because the degree of margin K for the critical conditions for generating dislocations in the semiconductor laser provided with the strained double quantum well structure active layer shown in FIG. 1 is $$K=4.6 > K_{safe}=3.9,$$

propagation of dislocations in the strained well layer is prevented and deterioration of the characteristics is suppressed even in a continuous operation of 1000 hours. In this way, by making the safety factor $K_{safe}$ 3.9, a strained multi-quantum well structure semiconductor laser having high reliability is obtained.

What is claimed is:
1. A semiconductor device comprising:
   a semiconductor substrate having a surface;
   a strained multi-quantum well (MQW) structure on the surface of the semiconductor substrate, the MQW structure comprising, alternatingly laminated, a plurality of first barrier layers, each first barrier layer comprising a semiconductor crystal having a lattice constant approximately equal to that of the semiconductor substrate, and n well layers, each well layer comprising a semiconductor crystal having a lattice constant larger than that of and an energy band gap smaller than that of the semiconductor substrate and including second barrier layers as outermost layers of the MQW structure, the well layers having, respectively, a thickness $t_w$, and the first barrier layers having a thickness $t_b$, and wherein when strain of each well layer is $f_w$, distance between an interface between a second barrier layer and a well layer closest to the semiconductor substrate and an interface between a second barrier layer and a well layer most distant from the semiconductor substrate is $$t_{total} = nt_w + (n-1)t_b,$$

average strain $f_{av}$ of the well layers between these interfaces is $$f_{av} = nt_w f_w / t_{total},$$

Poisson ratio in the well layer is $v$, Burgers vector magnitude of closed loop dislocations in the well layers is $b_0$, Burgers vector magnitude of open loop dislocations in the well layers is $b_p$, ratio of rigidity is $\mu$, stacking fault energy per unit area is $\gamma$, half loop radius of the dislocations is $r_c$, resolved sheer stress magnitude is $\tau$, pairs of open loop dislocations are spaced by a distance $d$, then $b_0 = 3\frac{1}{2} b_p$ and $$r_c = \frac{1}{(\sqrt{3}/2)\pi\tau b_0} \left[ \frac{\mu b_p^2(1-v/2)}{2(1-v)} \left(1 + \ln\frac{4r_c}{b_0}\right) + \pi d(\gamma + \tau b_p/2) \right],$$

where $\tau$ is $$\tau = \left[ \frac{2}{3} \sqrt{2}\ \mu(1+v)/(1-v) \right] f_{av}, \text{ and}$$

$$d = [\mu b_p^2(1-v/2)/4\pi(1-v)][1/(\gamma + \tau b_p/2)],$$

a safety factor $K_{safe} = 3.9$ and $$K_{safe} f_{av} t_{total} < \frac{b_p(1-v/2)}{80\sqrt{3}\ (1+v)} \left[ -\frac{1}{2} + \ln\left(\frac{4r_c}{b_0}\right) \right]$$

2. The semiconductor device of claim 1, wherein the strained MQW structure is an active layer of a semiconductor laser.

3. The semiconductor device of claim 1 wherein the semiconductor substrate comprises GaAs having a (001) surface and including a semiconductor substrate layer having a surface comprising a semiconductor crystal having a lattice constant that is approximately equal to that of GaAs, epitaxially grown on the (001) surface of the GaAs semiconductor substrate, and the strained MQW structure is disposed on the surface of the semiconductor substrate layer, the well layers in the strained MQW structure comprise InGaAs and the first and second barrier layers in the strained MQW structure comprise GaAs or AlGaAs, $b_0$ is 0.40 nm, $v$ is 0.31, $\mu$ is $3.2\times10^{11}$ erg/cm$^3$, and $\gamma$ is 18 erg/cm$^2$.

4. The semiconductor device of claim 3, wherein the strained MQW structure is an active layer of a semiconductor laser.

5. A method for fabricating a semiconductor device comprising:

growing on a first conductivity type semiconductor substrate a first cladding layer comprising a first conductivity type semiconductor crystal having a lattice constant approximately equal to that of the semiconductor substrate;

epitaxially growing a plurality of barrier layers and a plurality of well layers alternatingly laminated with each other, each barrier layer comprising a semiconductor crystal having a lattice constant that is approximately equal to that of and an energy band gap smaller than that of the first cladding layer and each well layer comprising a semiconductor crystal having a lattice constant larger than that of and an energy band gap smaller than that of the barrier layer, thereby forming a strained multi-quantum well structure having barrier layers as the outermost layers and serving as an active layer for generating laser light;

successively epitaxially growing on the active layer a second cladding layer comprising a semiconductor crystal having a lattice constant approximately equal to that of the semiconductor substrate and having a second conductivity type that is opposite to the first conductivity type;

forming an insulating film in a stripe shape on the second cladding layer and etching the second cladding layer using the insulating film as a mask, thereby forming a stripe-shaped mesa comprising a portion of the second cladding layer remaining beneath the insulating film;

selectively growing current blocking layers comprising a semiconductor crystal of the first conductivity type at both sides of the stripe-shaped mesa and then removing the insulating film;

epitaxially growing a contact layer comprising a second conductivity type semiconductor crystal on the current blocking layers and the second cladding layer;

forming a front surface electrode on the contact layer in ohmic contact with the contact layer and a rear surface electrode on the semiconductor substrate in ohmic contact with the semiconductor substrate; and forming cleaved surfaces perpendicular to the direction of extension of the stripe mesa as laser resonant facets wherein the well layers respectively have the thickness $t_w$, and the barrier layers other than the outermost layers of the strained MQW structure respectively have the thickness $t_b$, and wherein when the number of the well layers is n, the strain of each well layer is $f_w$, distance between an interface between a second barrier layer and a well layer closest to the semiconductor substrate and an interface between a second barrier layer and a well layer most distant from the semiconductor substrate is $$t_{total} = nt_w + (n-1)t_b,$$

average strain $f_{av}$ of the well layers between these interfaces is $$f_{av} = nt_w f_w / t_{total},$$

Poisson ratio in the well layer is $v$, Burgers vector magnitude of closed loop dislocations in the well layers is $b_0$, Burgers vector magnitude of open loop dislocations in the well layers is $b_p$, ratio of rigidity is $\mu$, stacking fault energy per unit area is $\gamma$, half loop radius of the dislocations is $r_c$, resolved sheer stress magnitude is $\tau$, pairs of open loop dislocations are spaced by a distance d, then $b_0 = 3\frac{1}{2} b_p$ and $$r_c = \frac{1}{(\sqrt{3}/2)\pi \tau b_0} \left[ \frac{\mu b_p^2 (1 - \nu/2)}{2(1-\nu)} \left( 1 + \ln \frac{4r_c}{b_0} \right) + \pi d(\gamma + \tau b_p/2) \right],$$

where $\tau$ is $$\tau = \left[ \frac{2}{3} \sqrt{2}\ \mu(1+\nu)/(1-\nu) \right] f_{av},$$

$d = [\mu b_p^2(1 - \nu/2)/4\pi(1-\nu)][1/(\gamma + \tau b_p/2)]$, and a safety factor $K_{safe} = 3.9$ and $$K_{safe} f_{av} t_{total} < \frac{b_p(1-\nu/2)}{80\sqrt{3}\ (1+\nu)} \left[ -\frac{1}{2} + \ln\left(\frac{4r_c}{b_0}\right) \right]$$

\* \* \* \* \*